United States Patent [19]

Yoshizaki

[11] Patent Number: 4,717,346
[45] Date of Patent: Jan. 5, 1988

[54] IC SOCKET

[75] Inventor: Tsutomu Yoshizaki, Yokosuka, Japan

[73] Assignee: Fujitsu Limited, Kanagaw, Japan

[21] Appl. No.: 942,015

[22] Filed: Dec. 12, 1986

Related U.S. Application Data

[63] Continuation of Ser. No. 769,809, Aug. 28, 1985, abandoned, which is a continuation of Ser. No. 534,212, Sep. 20, 1983, abandoned.

[30] Foreign Application Priority Data

Jul. 30, 1982 [JP]  Japan .................. 57-169507
Sep. 28, 1982 [JP]  Japan .................. 57-167524

[51] Int. Cl.⁴ .............................................. H01R 9/09
[52] U.S. Cl. .................................... 439/71; 439/331
[58] Field of Search .......... 339/17 CF, 75 M, 75 MP, 339/174; 220/326; 439/71-73, 331

[56] References Cited

PUBLICATIONS

IBM Bulletin, Betz et al., vol. 9, No. 11, pp. 1510, 4-1967.

Primary Examiner—Neil Abrams
Attorney, Agent, or Firm—Armstrong, Nikaido, Marmelstein & Kubovcik

[57] ABSTRACT

An integrated circuit (IC) socket comprising: a socket body of molded resin having a plurality of recesses for receiving a leadless chip carrier (LCC) type of IC device; and a cover which commonly covers the plurality of recesses for receiving an LCC type of IC device and presses said LCC type of IC device.

2 Claims, 11 Drawing Figures

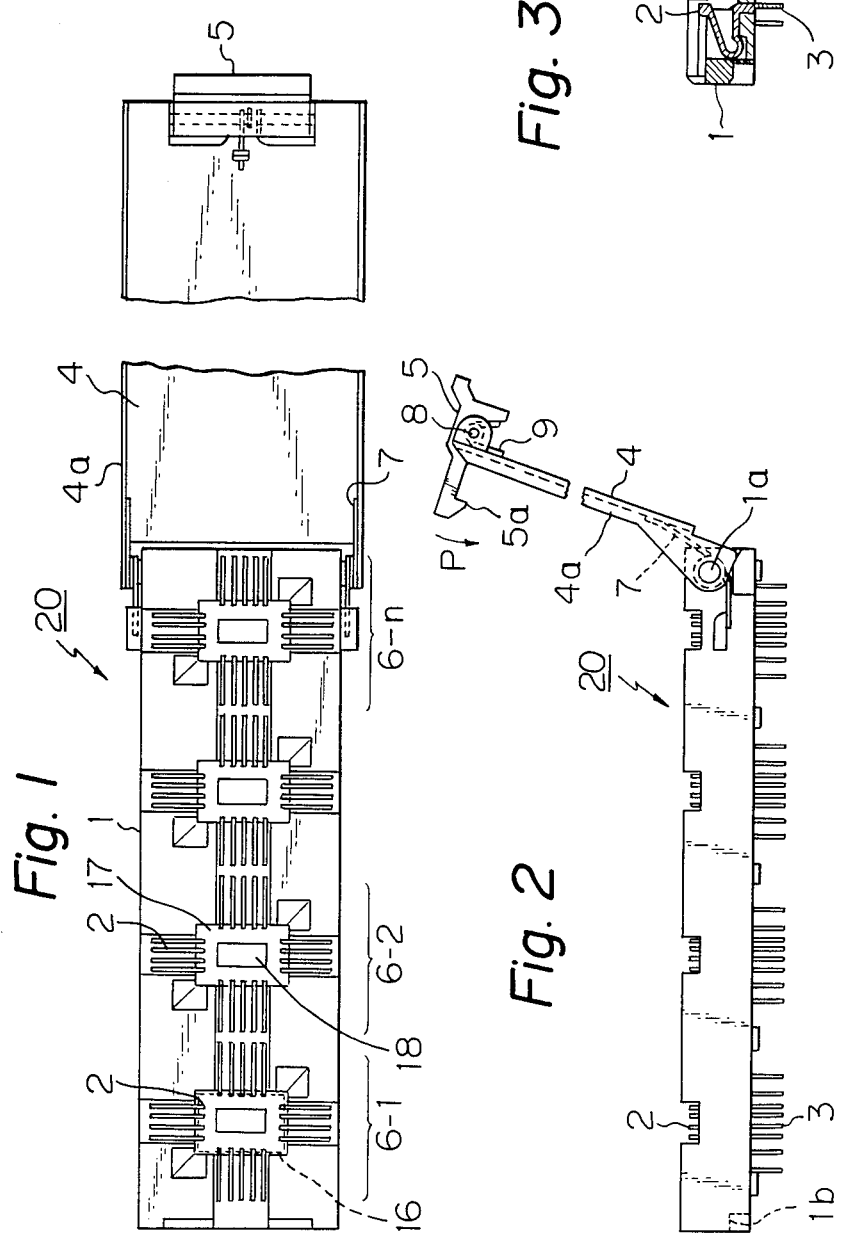

IC SOCKET

This application is a continuation of appliation Ser. No. 769,809 filed Aug. 28, 1985, which was a continuation of application Ser. No. 534,212, filed on Sept. 20, 1983, both cases, now abandoned.

BACKGROUND OF THE INVENTION

1. Field of the Invention

The present invention relates to an integrated circuit (IC) socket for receiving an IC device.

2. Description of the Prior Art

An IC socket is used for receiving an IC device such as a leadless chip carrier (LCC) when the IC device is burn-in tested and checked by various characteristic test processes. An IC socket is mounted on a printed board and is connected to circuit patterns formed thereon for testing the IC device. An IC socket is also used in various electronic circuits in which some of the IC devices thereof are dismountably installed in IC sockets instead of being directly mounted on the printed board and secured thereto so that the IC devices can be easily removed and easily replaced with other IC devices.

When IC devices are to be tested by using IC sockets or when a plurality of IC devices are to be mounted on a printed board by using IC sockets, it is necessary that a plurality of IC devices be compactly disposed on a printed board so as to increase the efficiency of the testing process or so as to obtain a compact electronic circuit. Also, it is desirable that the IC devices be easily manipulatable.

SUMMARY OF THE INVENTION

A purpose of the present invention is to provide an IC socket which makes it possible to dispose a plurality of IC devices compactly on a printed board and to easily manipulate them.

An IC socket in accordance with the present invention comprises: a socket body of molded resin having a plurality of recesses for receiving an LCC type of IC device; and a cover which commonly covers and presses the plurality of recesses for receiving an LCC type of IC device.

BRIEF DESCRIPTION OF THE DRAWINGS

FIG. 1 is a plan view of an IC socket according to the present invention.

FIG. 2 is a side view of the IC socket of FIG. 1.

FIG. 3 is a partial sectional view of the IC socket of FIG. 1, showing a contact thereof.

DESCRIPTION OF THE PREFERRED EMBODIMENTS

Figure 4:
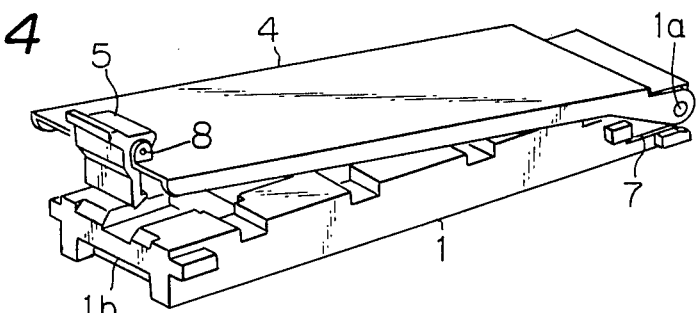
FIG. 4 is a perspective view of the IC socket of FIG. 1.

The embodiments of the present invention are described with reference to the drawings.

The IC socket of the present invention is applied for receiving LCC-type IC devices. An LCCtype IC device comprises a box-shaped molded body, an IC chip housed in the body, and a plurality of electrodes formed on the four side faces of the body. The lower end of each electrode slightly extends toward the bottom face of the body.

In FIG. 1 and FIG. 2, an IC socket 20 comprises a socket body 1, a plurality of contacts 2, a plurality of lead terminals 3 (each of which is integral with a contact 2 as is illustrated in FIG. 3), a pressing cover 4, and a locking lever 5 for the pressing cover 4.

The socket body 1 is of molded resin and comprises a plurality of socketing portions 6-1 to 6-n, each of which includes a plurality of contacts 2 and a plurality of lead terminals 3. The metallic pressing cover 4 comprises reinforcing rims 4a folded along the longitudinal edges thereof. An end of the cover 4 is pivotably disposed in a shaft 1a of the socket body 1. The cover 4 is forced open by a spring 7 disposed in the shaft 1a of the socket body 1. The locking lever 5 is pivotable about a pin 8 and is urged in the direction P by a spring 9. Each of the socketing portions 6-1 to 6-n receives an LCC-type IC device. The IC devices received by the socketing portions 6-1 to 6-n are pressingly and commonly covered by the cover 4. The cover 4 is locked by the locking lever 5 in such a manner that a hook 5a of the locking lever 5 engages a recess 1b of the socket body 1. The IC socket 20 is mounted on a printed board. A plurality of IC devices can be easily manipulated since the common cover 4 presses and holds them in the socketing portions with a snapping motion. Also, a plurality of IC devices can be compactly disposed on the printed board, unlike in the case of a plurality of individual IC sockets having only one socketing portion, since they are received in a common socket body and are covered by a common cover instead of being received in an individual IC socket. The IC socket of the present invention is small in size and low in cost since the socket body having a plurality of socketing portions can be made of molded resin.

The box-shaped LCC type of IC device is disposed in a recess 17, formed in the socket body 1, for receiving an IC device which IC device is depicted by the broken line 16. An opening 18 is formed in the bottom of each recess 17. If it is necessary to remove the IC device from the recess 17 before the IC socket is secured to the printed board, the IC device can be easily removed therefrom by pushing it upward through the opening 18. The contacts 2 are folded, as is illustrated in FIG. 3, so as to be formed as springy members. The contacts 2 resiliently contact the electrodes of the IC device from the bottom face thereof when the IC device is inserted into the recess 17.

Figure 5:
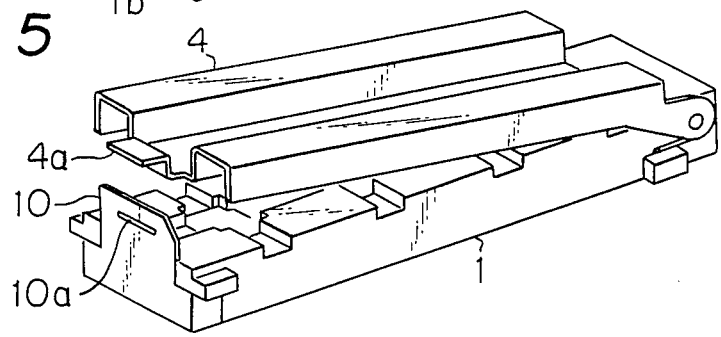
FIG. 5 is a perspective view of another IC socket according to the present invention.
Figure 6:
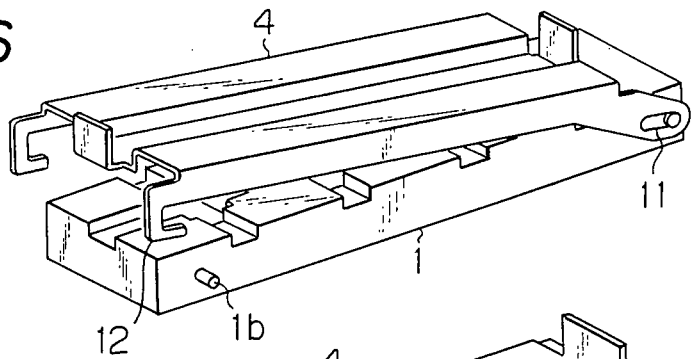
FIG. 6 is a perspective view of yet another IC socket according to the present invention.
Figure 7:
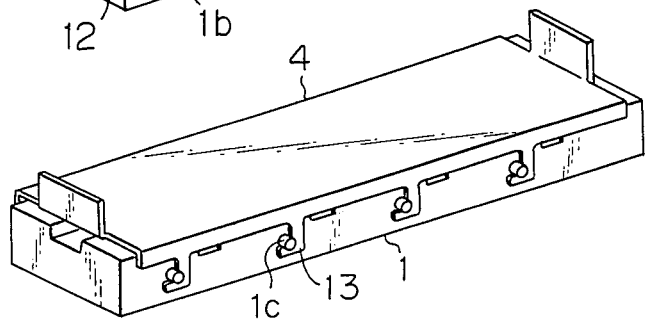
FIG. 7 is a perspective view of still another IC socket according to the present invention.
Figure 8:
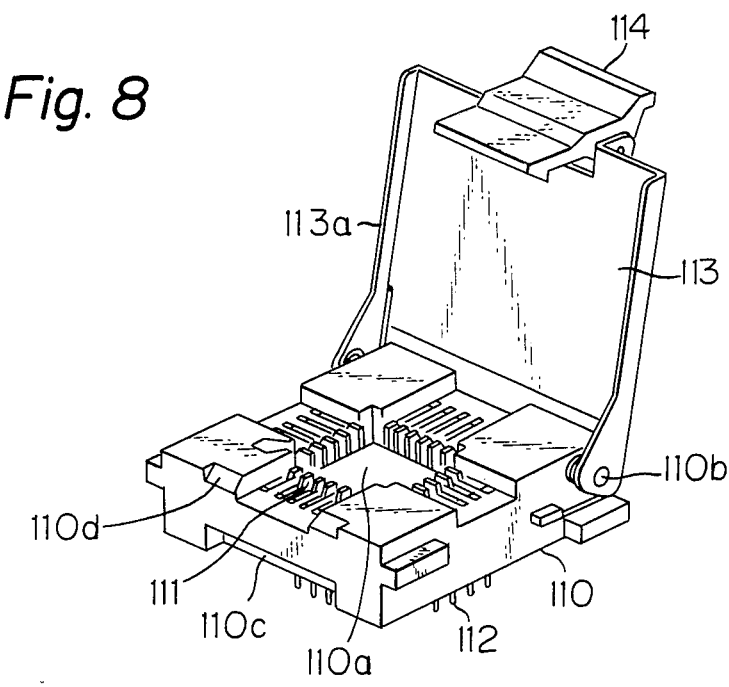
FIG. 8 is a perspective view of an IC socket having a cover structure according to the present invention.

Further examples of the IC socket of the present invention are illustrated in FIGS. 5 to 7. In these examples, the shape of the pressing cover and the shape of the locking means of the cover are different from those of the pressing cover and the locking means of the afore-mentioned example.

In the example of FIG. 5, the cover 4 is longitudinally corrugated so as to increase the rigidity thereof. The cover 4 is attached to the socket body 1 in the same manner as in the example of FIG. 4. The locking means of the cover 4 of FIG. 5 comprises a tongue 4a formed at the end of the cover 4, a spring plate 10 disposed at the end of the socket body 1, and a slot 10a formed in the spring plate 10 for receiving the tongue 4a.

In the example of FIG. 6, the cover 4 is attached to the socket body 1 through a slot 11. The locking means of the cover 4 of FIG. 6 comprises a hook 12 formed at the end of the cover 4 and a pin 16 provided on the side face of the socket body 1 for engagement with the hook 12.

In the example of FIG. 7, the cover 4 is dismountably attached to the socket body 1 with hooks 13 formed on both sides of the cover 4 and pins 1c formed on both sides of the socket body 1 for engagement with the hooks 13.

As was mentioned above, in accordance with the present invention, a low-cost compact IC socket having a plurality of socketing portions can be obtained by molding the socket body with resin, which IC socket makes it possible to dispose a plurality of IC devices compactly on a printed board and to easily manipulate them.

A preferred structure of the pressing cover of the IC socket according to the present invention is illustrated in FIGS. 8 to 11.

In the drawings, a socket body 110, a plurality of contacts 111, a plurality of lead terminals 112 (each of which is integral with a contact 111), a pressing cover 113, and a locking lever 114 are illustrated. The socket body 110 is a mold of resin. A recess 110a for receiving an LCC-type IC device is formed in the center of the socket body 110. The socket body 110 comprises a shaft 110b for supporting the pressing cover 113 and a recess 110c for engagement with the locking lever 114. The contacts 111 are springy in a vertical direction and are disposed along the four sides of the recess 110a. The contacts 111 may be disposed along two or three sides of the recess 110a instead of along all four sides thereof in accordance with the arrangement of the electrodes of the IC device to be received by the recess 110a. The IC device is placed on the contacts 111 and is pressed down by the pressing cover 113 so that the contacts 111 and the electrodes formed on the bottom face of the IC device resiliently contact each other.

Figure 10:
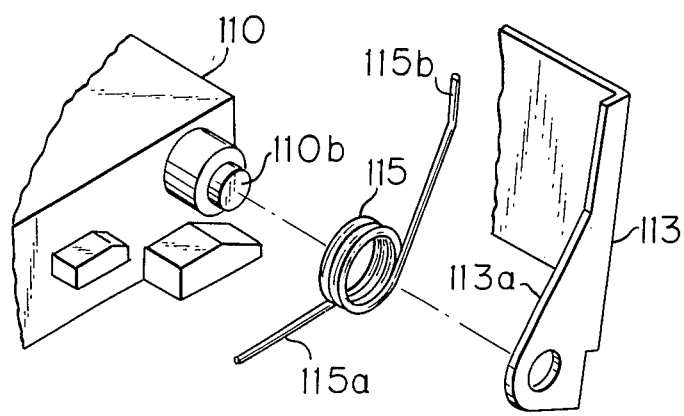
FIG. 10 is a disassembled view of the spring means of the cover structure of the IC socket of FIG. 8.
Figure 11:
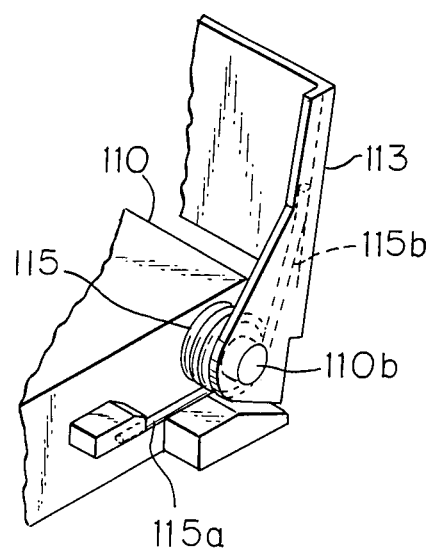
FIG. 11 is an assembled view of the spring means of FIG. 10.

The pressing cover 113 is made of a metallic plate which is folded along each side thereof so as to form a reinforcing rim 113a. The pressing cover 113 is pivotably mounted on the shaft 110b of the socket body 110. A first coil spring 115 is disposed between the socket body 110 and the pressing cover 113, as is illustrated in FIGS. 10 and 11, in such a manner that one end 115a thereof is secured to the socket body 110 and the other end 115b thereof engages with the inside of the pressing cover 113 so as to force the pressing cover 113 open.

Figure 9:
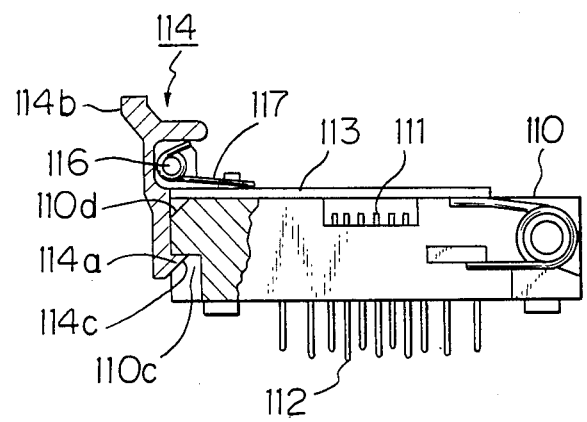
FIG. 9 is a partial sectional side view of the IC socket of FIG. 8.

The locking lever 114 is a mold of resin having the sectional shape illustrated in FIG. 9 and comprises a hook 114a and a handle 114b. The locking lever 114 is pivotably disposed on a pin 116 provided on the pressing cover 113. A second coil spring 117 is disposed between the locking lever 114 and the pressing cover 113 in such a manner that the locking lever 114 is forced in the direction in which the hook 114a engages with the recess 110c.

After the IC device is placed in the recess 110a of the socket body 110, the pressing cover 113 is closed. In the closing movement of the pressing cover 113, a tapered surface 114c formed on the hook 114a of the locking lever 114 abuts against a tapered surface 110d formed on the socket body 110 so that the locking lever 114 is opened against the force of the spring 117 as the pressing cover 113 is closed. At the end of the closing movement of the pressing cover 113, the hook 114a of the locking lever 114 engages with the recess 110c of the socket body 110 due to the force of the spring 117 so that the pressing cover 113 is locked. The IC device is pressed and held in the recess 110a by the pressing cover 113 in such a manner that the contacts 111 resiliently contact the electrodes of the IC device from the bottom side thereof.

If it is necessary to remove the IC device housed in the IC socket, this can be done by pushing up the handle 114b of the locking lever 114 so that the hook 114a is disengaged from the recess 110c of the socket body 110 and the pressing cover 113 is released from its locking position by the locking lever 114. The pressing cover 113 is held open by the first coil spring 115. Therefore, the IC device to be housed in or removed from the IC socket can be easily manipulated.

We claim:

1. An IC socket for leadless chip carrier type IC device, said IC socket comprising:

a socket body of molded resin having a plurality of recesses for receiving a plurality of said IC devices;

a cover which commonly covers said plurality of recesses for receiving said IC devices and which biases said IC devices toward said socket body;

a plurality of springy contacts arranged in said socket body, each contact resiliently contacting corresponding electrodes of the IC device from the bottom side thereof;

said cover being pivotally mounted on said socket body at an end thereof and including,
  (a) a first spring biasing said cover to the open position
  (b) a locking lever having a hook on a tip thereof and being pivotally mounted on said cover at the end opposite from said first spring, said hook being engaged with a latching recess in said socket body for securing said cover in the closed position and
  (c) a second spring biasing said hook to the closed position for engagement with said latching recess, said hook having a tapered surface which abuts said socket body during closing to force said locking lever and hook against the biasing force of said second spring, away from said latching recess to allow said hook to latch with said latching recess; and an opening in the bottom each said recess of said socket body, such that an IC device in said recess may be pushed outward from said recess by an object inserted through said opening;

wherein said socket body includes grooves in which said springy contacts are disposed, said grooves being positioned at the sides of each of said recesses on an upper surface thereof, each of said grooves opening at an upper edge of a side surface of said socket body, and wherein each of said springy contacts comprise a U-shaped springy portion having an upward projection formed at an end of one leg of said U-shaped springy portion, and an integral pin-like lead terminal projection perpendicularly from the bottom surface of said socket body, said lead terminal being formed on the other leg of leg of said U-shaped springy portion.

2. The IC socket of claim 1, wherein said cover is longitudinally corrupgated between said first spring and said hook.

* * * * *